(12) United States Patent
Harada et al.

(10) Patent No.: US 10,673,478 B2
(45) Date of Patent: Jun. 2, 2020

(54) ASYNCHRONOUS COMMUNICATION DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventors: Kyoji Harada, Fujisawa Kanaga (JP); Ryouta Niwa, Yokohama Kanagawa (JP); Katsumichi Katou, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/266,137

(22) Filed: Feb. 4, 2019

(65) Prior Publication Data

US 2020/0067553 A1 Feb. 27, 2020

(30) Foreign Application Priority Data

Jul. 25, 2018 (JP) .................. 2018-139183

(51) Int. Cl.
*H04B 5/00* (2006.01)
*H04B 1/38* (2015.01)
*H03K 5/00* (2006.01)

(52) U.S. Cl.
CPC .............. *H04B 1/38* (2013.01); *H03K 5/00* (2013.01); *H03K 2005/00026* (2013.01)

(58) Field of Classification Search
CPC .. H04L 12/4013; Y02D 50/10; H03K 5/1565; H03K 5/00; H03K 2005/00026; H04B 1/0483; H04B 1/38
See application file for complete search history.

(56) References Cited

U.S. PATENT DOCUMENTS 5,365,547 A * 11/1994 Marinaro .............. H04L 7/0338
327/291
6,879,651 B2 4/2005 Saeki

FOREIGN PATENT DOCUMENTS

| JP | H05-30031 A | 2/1993 |
| JP | H07-312627 A | 11/1995 |
| JP | 2002-007322 A | 1/2002 |
| JP | 2011-91742 A | 5/2011 |

* cited by examiner

*Primary Examiner* — Rahel Guarino
(74) *Attorney, Agent, or Firm* — White & Case LLP

(57) ABSTRACT

According to one embodiment of an asynchronous communication device, the transmitter circuit includes a signal generation circuit to output a first pulse signal and a delay compensation circuit to receive the first pulse signal, perform delay compensation processing on the pulse width of the first pulse signal, and output a second pulse signal obtained by the delay compensation processing. The delay unit receives the second pulse signal, causes delay in the rising or falling edge of the second pulse signal, and outputs a third pulse signal in which the delay is caused. The receiver circuit receives the third pulse signal and performs signal processing based on the third pulse signal. The delay compensation circuit, while maintaining the pulse period of the first pulse signal, performs pre-compensation processing on the first pulse signal based on a delay value of the delay to be caused by the delay unit.

19 Claims, 15 Drawing Sheets

| AMBIENT TEMPERATURE | FALL DELAY VALUE | RISE DELAY VALUE |
|---|---|---|
| T0 | tf0 | tr0 |
| T1 | tf1 | tr1 |
| T2 | tf2 | tr2 |
| ⋮ | ⋮ | ⋮ |
| Tn | tfn | trn |

$T0 < T1 < T2 \cdots < Tn$
$tf0 < tf1 < tf2 \cdots < tfn$
$tr0, tr1, tr2 \cdots, trn$ (SUBSTANTIALLY THE SAME)

FIG. 15

ASYNCHRONOUS COMMUNICATION DEVICE

CROSS REFERENCE TO RELATED APPLICATION

This application is based upon and claims the benefit of priority from the prior Japanese Patent Application No. 2018-139183, filed on Jul. 25, 2018, the entire contents of which are incorporated herein by reference.

FIELD

Embodiments discussed herein are related to an asynchronous communication device.

BACKGROUND

In recent years, asynchronous circuits have been used in many fields due to their advantages over synchronous circuits, such as lower power consumption, higher-speed operation, and lower electromagnetic radiation. Since asynchronous circuits involve no timing signals, delay control is extremely important.

A universal asynchronous receiver-transmitter (UART) is provided with a photocoupler between a transmitter and a receiver to perform switching operation on a pulse signal outputted from the transmitter. The photocoupler functions as a delay unit to delay a pulse signal. Unlike wiring, cables, and the like that transfer pulse signals, the photocoupler may delay the rising edge or falling edge of a pulse signal.

Such a delay in a pulse signal hinders normal data transmission and reception between the transmitter and the receiver. Therefore, it is difficult to perform normal data transmission and reception.

BRIEF DESCRIPTION OF THE DRAWINGS

FIG. 15 is a diagram illustrating the temperature characteristics of a photocoupler according to the sixth embodiment;

DETAILED DESCRIPTION

Figure 1:
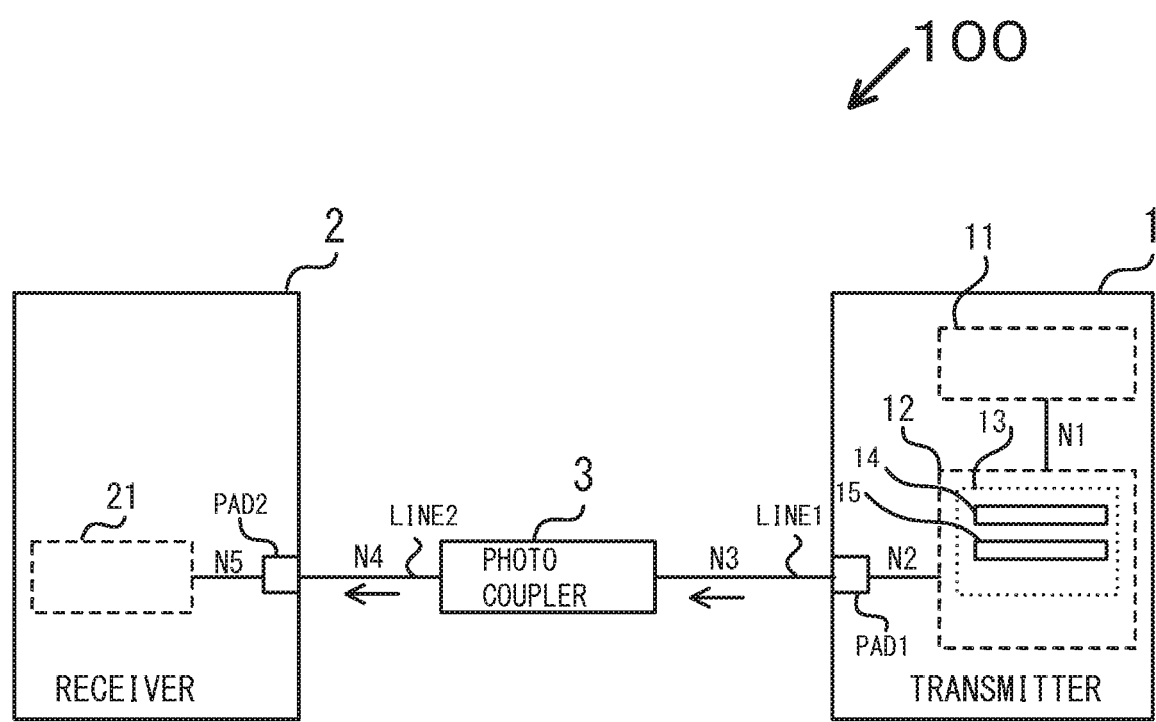
FIG. 1 is a diagram illustrating an asynchronous communication device according to a first embodiment.

According to one embodiment, an asynchronous communication device includes a transmitter circuit, a delay unit, and a receiver circuit. The transmitter circuit includes a signal generation circuit to output a first pulse signal and a delay compensation circuit to receive the first pulse signal, perform delay compensation processing on the pulse width of the first pulse signal, and output a second pulse signal obtained by the delay compensation processing. The delay unit receives the second pulse signal, causes delay in the rising or falling edge of the second pulse signal, and outputs a third pulse signal in which the delay is caused. The receiver circuit receives the third pulse signal and performs signal processing based on the third pulse signal. The delay compensation circuit, while maintaining the pulse period of the first pulse signal, performs pre-compensation processing on the first pulse signal based on a delay value of the delay to be caused by the delay unit.

More embodiments are described below with reference to the drawings. Throughout the drawings, the same reference numerals denote the same or like portions.

An asynchronous communication device according to a first embodiment is described with reference to some of the drawings. FIG. 1 is a diagram illustrating the asynchronous communication device.

In the first embodiment, a delay compensation circuit is provided in a transmitter circuit. To compensate for a falling edge delay of a pulse signal to be caused by a photocoupler (delay unit), the delay compensation circuit performs pre-compensation processing on the pulse signal based on a falling edge delay value for the photocoupler (delay unit), and outputs a pulse signal obtained by the compensation processing to the photocoupler (delay unit).

As illustrated in FIG. 1, an asynchronous communication device 100 includes a transmitter circuit 1, a receiver circuit 2, a photocoupler 3, wiring LINE1, and wiring LINE2.

The asynchronous communication device 100 is incorporated in, for example, a microcontroller or the like, and is used for control of an apparatus such as an air conditioner or a washing machine. The asynchronous communication device 100 may be entirely mounted onto one chip, or the transmitter circuit and the receiver circuit of the asynchronous communication device 100 may be mounted on different chips and connected by a transmission unit (photocoupler).

The transmitter circuit 1 includes a signal generation circuit 11, a delay compensation circuit 12, and a terminal PAD1. The signal generation circuit 11 generates a first pulse signal and outputs the first pulse signal to the delay compensation circuit 12 via a node N1. The delay compensation circuit 12 includes a settings register 13. The settings register 13 stores a falling edge delay value 14 and a rising edge delay value 15. The falling edge delay value 14 is a value corresponding to a falling edge delay to be caused in a pulse signal by the photocoupler (delay unit). The rising edge delay value 15 is a value corresponding to a rising edge delay to be caused in a pulse signal by the photocoupler (delay unit). The falling edge delay value 14 includes different delay values, and the rising edge delay value 15 includes different delay values.

The delay compensation circuit 12 performs pre-compensation processing on the first pulse signal based on the delay value for the photocoupler 3 and outputs a second pulse signal obtained by the compensation processing to the terminal PAD1 via a node N2. Specific operation of the delay compensation circuit 12 will be detailed later.

The wiring LINE1 is connected at one end to the terminal PAD1 and at the other end to the photocoupler 3. The second pulse signal obtained by the compensation processing is inputted to the photocoupler 3 via the node N2, the terminal PAD1, and a node N3.

Figure 2:
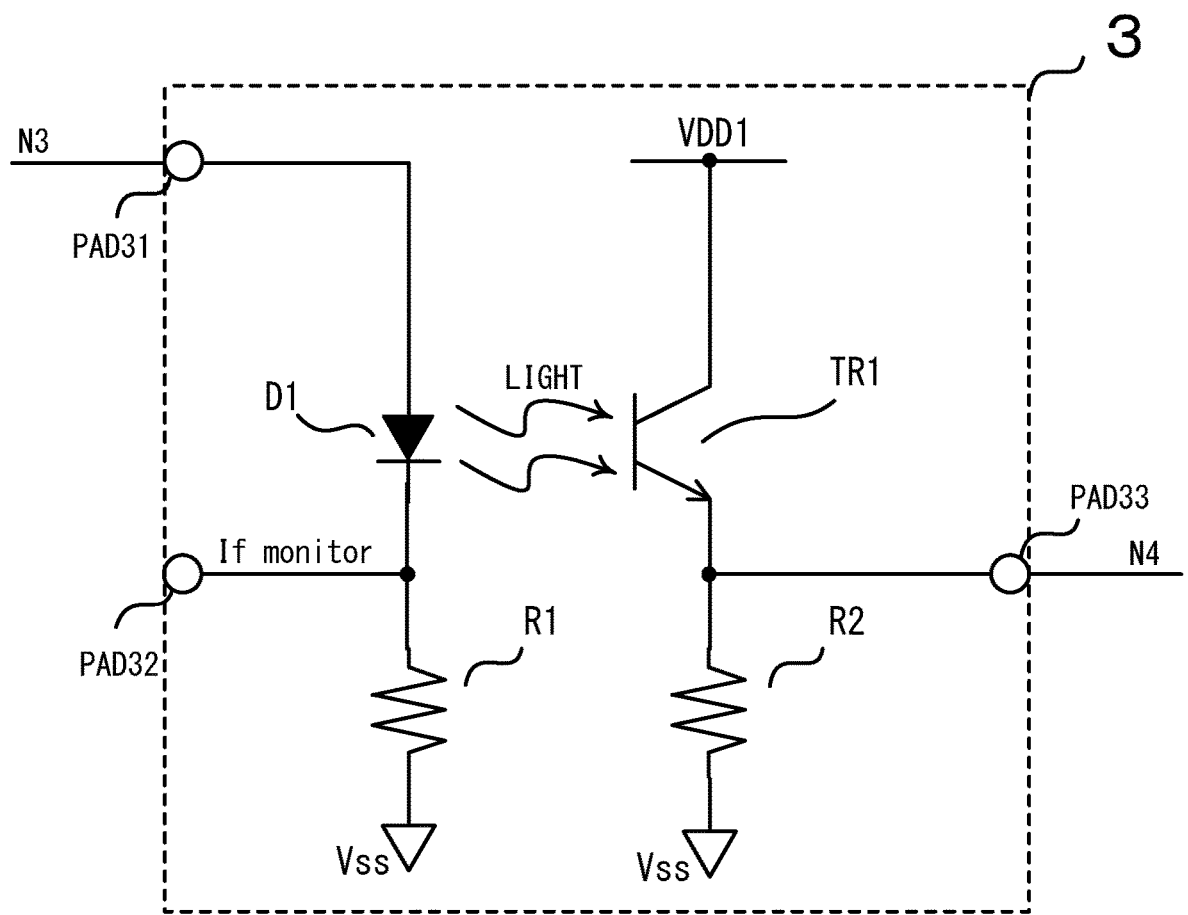
FIG. 2 is a circuitry diagram illustrating a photocoupler according to the first embodiment.

The circuitry configuration of the photocoupler 3 used in the asynchronous communication device 100 is described with reference to FIG. 2. FIG. 2 is a circuitry diagram illustrating the photocoupler.

As illustrated in FIG. 2, the photocoupler 3 includes a diode D1, terminals PAD31 to PAD33, a resistance R1, a resistance R2, and a transistor TR1. The photocoupler 3 performs switching operation on a signal at the node N3 (the second pulse signal).

The photocoupler 3 operates as a delay unit and is used to protect the transmitter circuit 1 and the receiver circuit 2, for example. As another delay unit, a circuit functioning to apply some sort of load, e.g., wiring, a diode, an LED, a resistance, a capacitor, or the like that causes delay, may be connected.

The diode D1 has an anode connected to the node N3 via the terminal PAD31 and a cathode connected to the terminal PAD32. The diode D1 is a photodiode that operates to emit light when voltage is applied to the anode. Currents that flow during operation of the diode D1 are monitored via the terminal PAD32. The resistance R1 is connected at one end to the cathode of the diode D1 and the terminal PAD32 and at the other end to a ground potential (low-potential power source) Vss. The resistance R2 is a load resistance.

The transistor TR1 is an NPN transistor having a collector connected to a power source (high-potential power source) VDD1, an open base, and an emitter connected to a node N4 via the terminal PAD33. The transistor TR1 operates when the base is radiated with light from the diode D1. The resistance R2 is a load resistance connected at one end to the emitter of the transistor TR1 and the terminal PAD33 and at the other end to the ground potential (low-potential power source) Vss.

Figure 3:
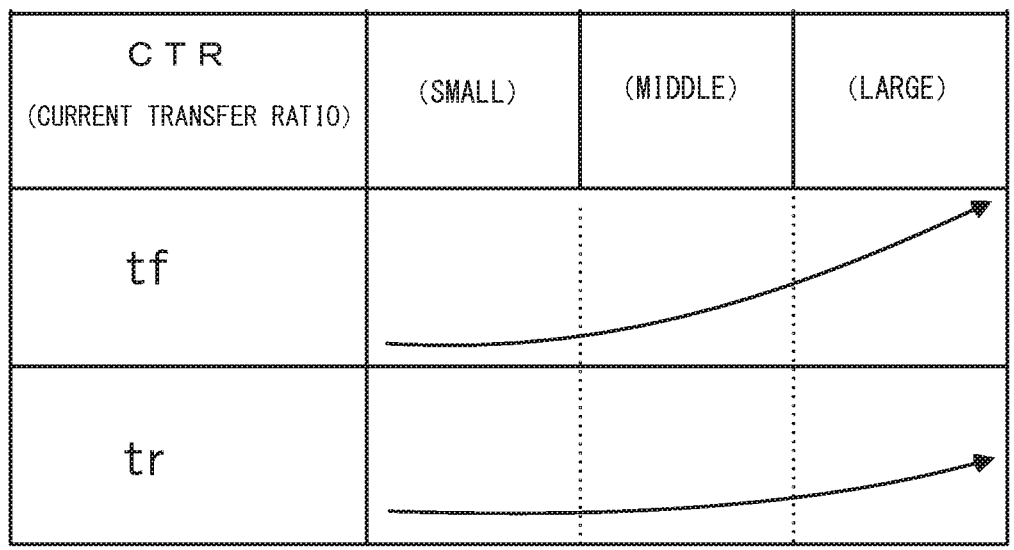
FIG. 3 is a diagram illustrating the characteristics of the photocoupler according to the first embodiment.

The characteristics of the photocoupler are described with reference to FIG. 3. FIG. 3 is a diagram illustrating the characteristics of the photocoupler.

As illustrated in FIG. 3, when the resistance R2 (load resistance) of the photocoupler is relatively large (e.g., 5 KΩ or above), tr (rising edge delay time)<<tf (falling edge delay time). When the resistance R2 (load resistance) of the photocoupler is relatively medium (e.g., 0.5 KΩ to 5 KΩ), tr (rising edge delay time)<tf (falling edge delay time). When the resistance R2 (load resistance) of the photocoupler is relatively small (e.g., 0.2 KΩ or below), tr (rising edge delay time)>tf (falling edge delay time).

The rising edge delay time tr of the photocoupler gradually increases as the current transfer ratio (CTR) increases. In contrast, the falling edge delay time tf increases more drastically than the rising edge delay time tr of the photocoupler as the current transfer ratio (CTR) increases.

In the asynchronous communication device 100 of the first embodiment, a falling edge delay caused by the photocoupler 3 accounts for most of the signal delay in a pulse signal transmitted from the transmitter circuit 1 to the receiver circuit 2. For example, the photocoupler 3 uses a photocoupler illustrated in FIG. 2, with a large load resistance (R2) and a high current transfer ratio (CTR).

In other words, for example, the falling edge delay time tf of the photocoupler 3 is longer than the rising edge delay time tr of the photocoupler 3 by one digit or more. The falling edge delay time tf of the photocoupler 3 is longer than the time of delay caused by the wiring LINE1, the wiring LINE2, the internal wiring of the transmitter circuit 1, and the internal wiring of the receiver circuit 2. Further, the difference between a falling edge delay and a rising edge delay in the wiring is small.

The photocoupler 3 receives a pulse signal obtained by pre-compensation processing (the second pulse signal) via the node N2, the terminal PAD1, and the node N3. The photocoupler 3 delays the falling edge of the second pulse signal obtained by the compensation processing.

The wiring LINE2 is connected at one end to the photocoupler 3 and at the other end to a terminal PAD2 of the receiver circuit 2. A third pulse signal, which is a pulse signal with a delayed falling edge, is outputted from the photocoupler 3 and inputted to the terminal PAD2 of the receiver circuit 2 via the node N4.

Figure 4:
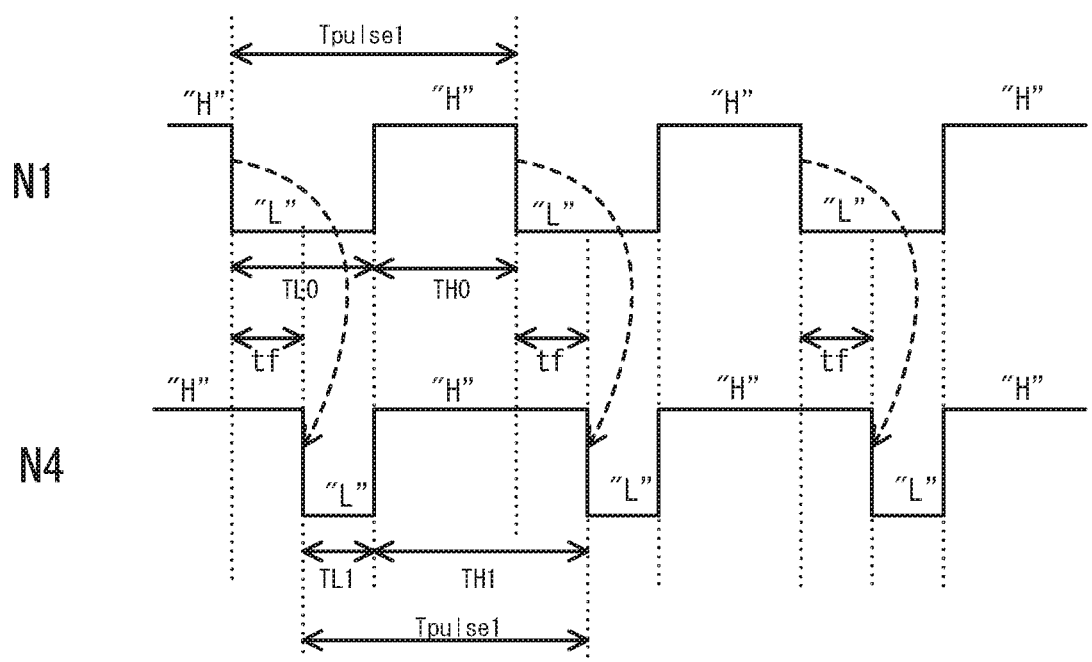
FIG. 4 is a timing chart illustrating signal delay caused by the photocoupler according to the first embodiment.

Next, operation of the asynchronous communication device 100 of the first embodiment is described with reference to FIGS. 4 and 5. FIG. 4 is a timing chart illustrating signal delay caused by the photocoupler, and FIG. 5 is a timing chart illustrating the operation of the asynchronous communication device.

As illustrated in FIG. 4, a first pulse signal outputted from the signal generation circuit 11 is directly inputted to the photocoupler 3 when the delay compensation circuit 12 does not perform delay compensation on the first pulse signal. A pulse signal at the node N1 (a first pulse signal) has a pulse period Tpulse1, a high-level period (pulse width) TH0, and a low-level period TL0 (e.g., a pulse signal with a duty ratio of 50% to 50%).

A pulse signal with a delayed falling edge outputted from the photocoupler 3 has the same pulse period Tpulse1 as the first pulse signal, a high-level period TH1, which is (TH0+tf), and a low-level period TL1, which is (TL0−tf).

Figure 5:
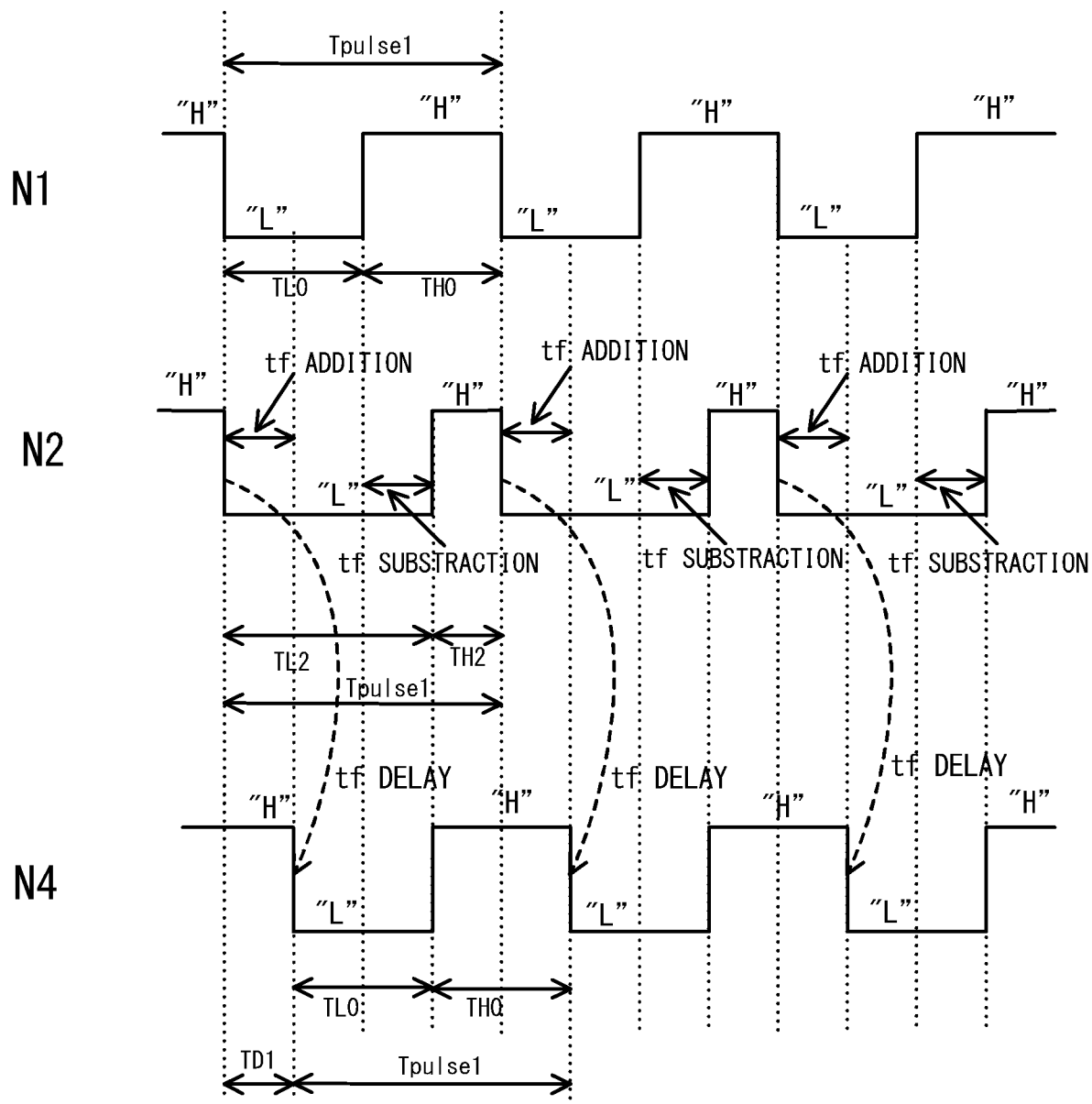
FIG. 5 is a timing chart illustrating operation of the asynchronous communication device according to the first embodiment.

As illustrated in FIG. 5, once the asynchronous communication device 100 starts operation, a first pulse signal outputted from the signal generation circuit 11 is inputted to the delay compensation circuit 12 via the node N1.

The delay compensation circuit 12 performs delay compensation processing on the first pulse signal using the falling edge delay value 14 corresponding to a falling edge delay value for the photocoupler 3 stored in the settings register 13. Specifically, maintaining the same pulse period as that of the first pulse signal, the delay compensation circuit 12 changes the low-level period to TL2 by adding a falling edge delay time tf to the low-level period of the first pulse signal and changes the high-level period to TH2 by subtracting the falling edge delay time tf from the high-level period (pulse width) of the first pulse signal.

The delay compensation circuit 12 performs pre-compensation processing on the first pulse signal based on a falling edge delay value for the photocoupler 3, and outputs a second pulse signal obtained by the compensation processing to the photocoupler 3 via the node N2, the terminal PAD1, and the node N3.

The photocoupler 3 receives the second pulse signal obtained by the pre-compensation processing. The photocoupler 3 delays the falling edge of the second pulse signal by the falling edge delay time tf. Specifically, a third pulse signal outputted from the photocoupler 3 maintains the same pulse period Tpulse1 as the first pulse signal. Since the falling edge of the second pulse signal is delayed by the falling edge delay time tf, the third pulse signal has the high-level period TH0 and the low-level period TL0. The third pulse signal has signal delay (TD1) relative to the pulse signal (first pulse signal).

The third pulse signal, which is asynchronous with the first pulse signal but has the same pulse width and duty ratio as the first pulse signal, is transmitted to the receiver circuit 2 via the node N4. As a result, normal data receiving processing is performed by a signal processing circuit 21 of the receiver circuit 2 based on the third pulse signal.

As described above, the asynchronous communication device 100 of the first embodiment is provided with the transmitter circuit 1, the receiver circuit 2, the photocoupler 3, the wiring LINE1, and the wiring LINE2. The transmitter circuit 1 includes the signal generation circuit 11, the delay compensation circuit 12, and the terminal PAD1. The delay compensation circuit 12 includes the settings register 13 that has the falling edge delay value 14 and the rising edge delay value 15. The delay compensation circuit 12 performs delay compensation processing on a first pulse signal using the falling edge delay value 14 corresponding to a falling edge delay value for the photocoupler 3 stored in the settings register 13, and transmits a second pulse signal obtained by the delay pre-compensation processing to the photocoupler 3. The photocoupler 3 delays the falling edge of the second pulse signal by a falling edge delay time tf, and transmits a third pulse signal with the delayed falling edge to the receiver circuit 2.

Thus, even if a signal transmitted from the transmitter circuit 1 to the receiver circuit 2 suffers a delay, normal data transmission and reception can be achieved.

Note that although a photocoupler is used as a delay unit in the first embodiment, the invention is not limited to the above case. For example, an isolator may be used instead of a photocoupler. The isolator may be one that transfers a signal by utilizing magnetic coupling using a pair of coils opposing each other with an insulator interposed in between, or one that utilizes capacitive coupling and connects the electrodes of a parallel plate capacitor to the transmitter end and the receiver end, respectively.

Delay compensation processing can be performed to compensate for a rising or falling edge delay caused by these isolators.

Figure 6:
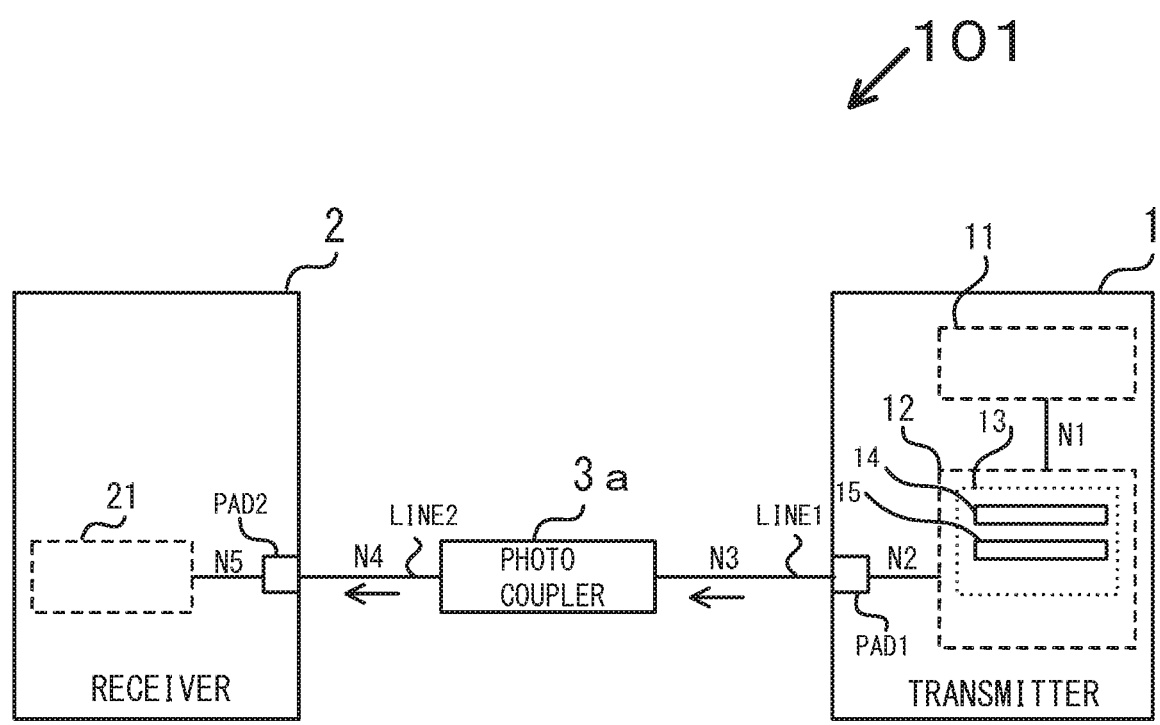
FIG. 6 is a diagram illustrating an asynchronous communication apparatus according to a second embodiment.

An asynchronous communication device according to a second embodiment is described with reference to some of the drawings. FIG. 6 is a diagram illustrating the asynchronous communication device.

In the second embodiment, a delay compensation circuit performs pre-compensation processing on a pulse signal based on a delay value for the photocoupler (delay unit) to compensate for a rising edge delay to be caused in the pulse signal by the photocoupler (delay unit), and outputs a pulse signal obtained by the compensation processing to the photocoupler (delay unit).

The same portions as those in the first embodiment are denoted by the same reference signs and are not described below. Only differences will be described.

As illustrated in FIG. 6, an asynchronous communication device 101 includes the transmitter circuit 1, the receiver circuit 2, a photocoupler 3a, the wiring LINE1, and the wiring LINE2.

In the asynchronous communication device 101 of the second embodiment, a rising edge delay caused by the photocoupler 3a accounts for most of the signal delay in a signal transmitted from the transmitter circuit 1 to the receiver circuit 2. For example, the photocoupler 3a uses a photocoupler illustrated in FIG. 2, with a small load resistance (R2) and a low current transfer ratio (CTR).

In other words, the rising edge delay time tr of the photocoupler 3a is longer than the falling edge delay time tf of the photocoupler 3a. The rising edge delay time tr of the photocoupler 3a is longer than the time of delay caused by the wiring LINE1, the wiring LINE2, the internal wiring of the transmitter circuit 1, and the internal wiring of the receiver circuit 2. Further, the difference between falling edge delay and rising edge delay in the wiring is small.

The delay compensation circuit 12 performs pre-compensation processing on a first pulse signal based on a rising edge delay value for the photocoupler 3a, and outputs a second pulse signal obtained by the compensation processing to the photocoupler 3a via the node N2, the terminal PAD1, and the node N3.

The photocoupler 3a receives the second pulse signal obtained by the pre-compensation processing. The photocoupler 3a delays the rising edge of the second pulse signal by a rising edge delay time tr.

Figure 7:
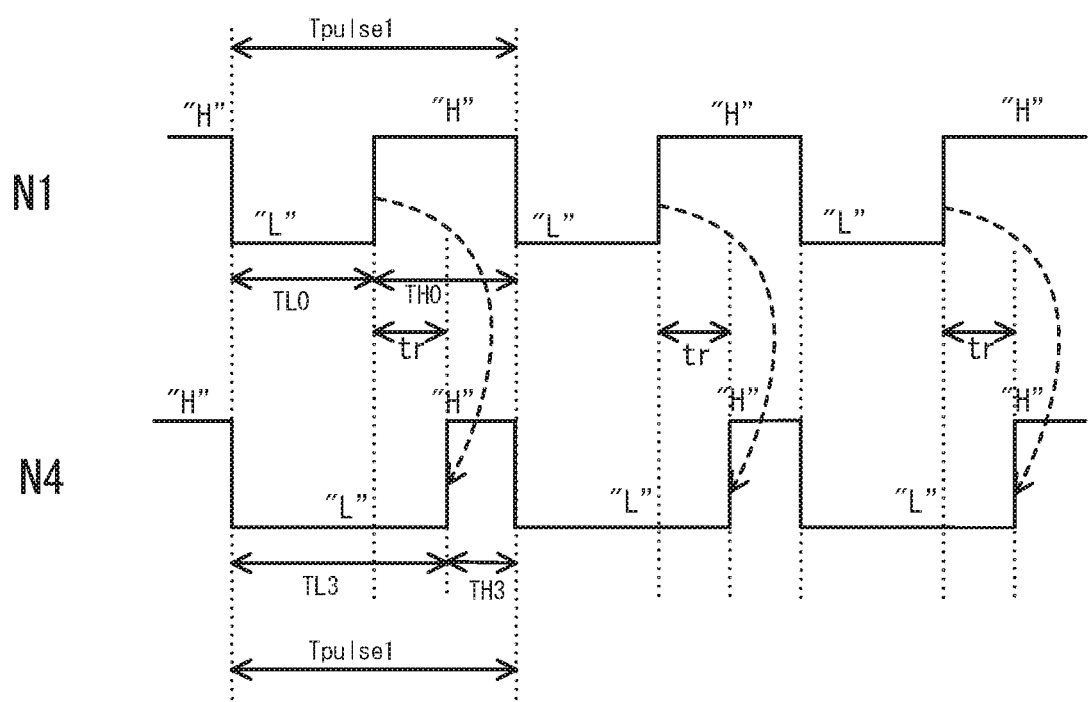
FIG. 7 is a timing chart illustrating signal delay caused by a photocoupler according to the second embodiment.

Next, operation of the asynchronous communication device 101 of the second embodiment is described with reference to FIGS. 7 and 8. FIG. 7 is a timing chart illustrating signal delay caused by the photocoupler, and FIG. 8 is a timing chart illustrating the operation of the asynchronous communication device.

As illustrated in FIG. 7, a first pulse signal outputted from the signal generation circuit 11 is directly inputted to the photocoupler 3a when the delay compensation circuit 12 does not perform delay compensation on the first pulse signal.

A pulse signal with a delayed rising edge outputted from the photocoupler 3a has the same pulse period Tpulse1 as the pulse signal (first pulse signal), a low-level period TL3, which is (TL0+tr), and a high-level period TH3, which is (TH0−tr).

Figure 8:
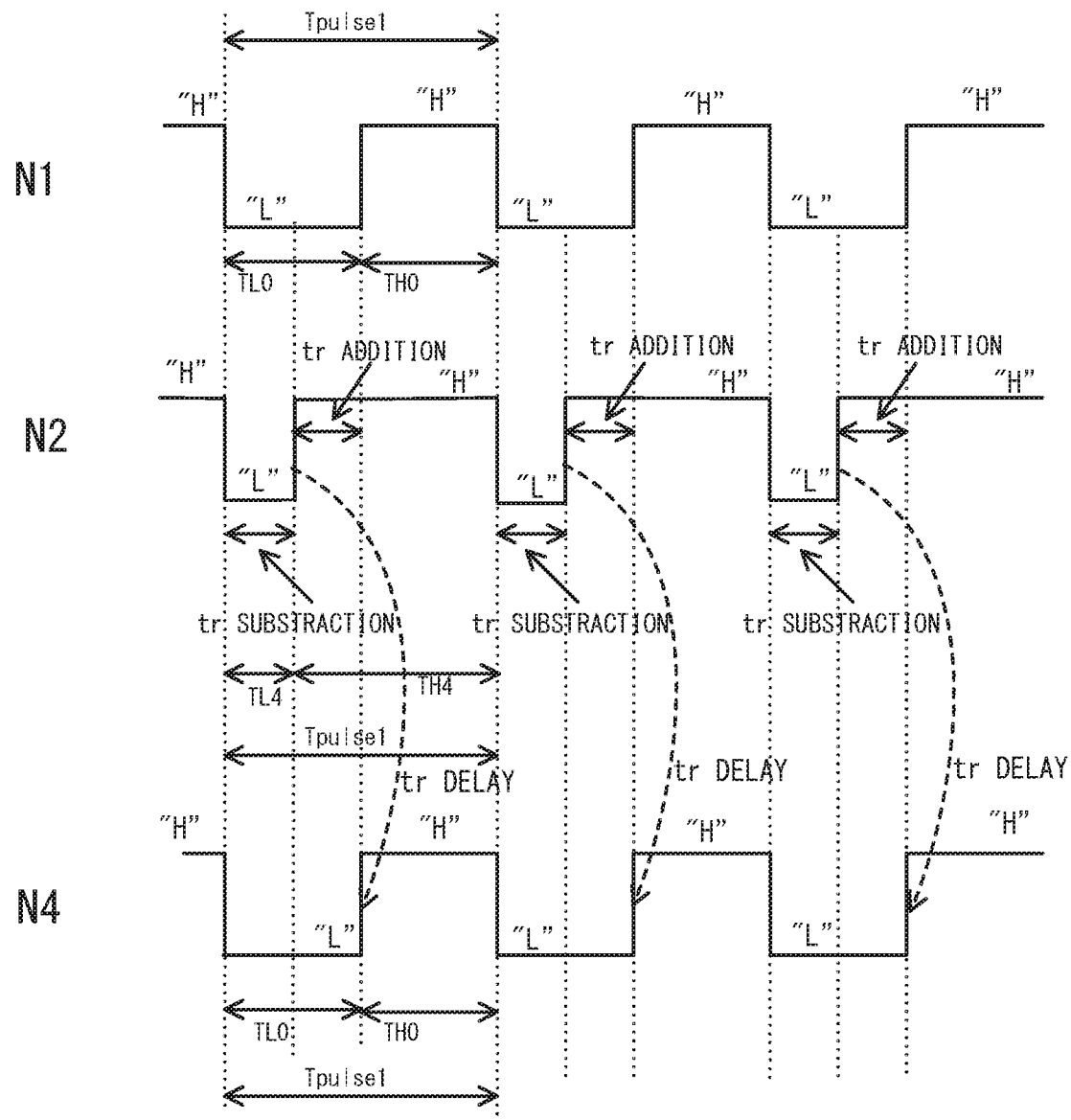
FIG. 8 is a timing chart illustrating operation of the asynchronous communication device according to the second embodiment.

As illustrated in FIG. 8, once the asynchronous communication device 101 starts operation, a first pulse signal outputted from the signal generation circuit 11 is inputted to the delay compensation circuit 12 via the node N1.

The delay compensation circuit 12 performs delay compensation processing on the first pulse signal using the rising edge delay value 15 corresponding to a rising edge delay value for the photocoupler 3a stored in the settings register 13. Specifically, maintaining the same pulse period as that of the first pulse signal, the delay compensation circuit 12 changes the low-level period to TL4 by subtracting a rising edge delay time tr from the low-level period of the first pulse signal and changes the high-level period to TH4 by adding the rising edge delay time tr to the high-level period (pulse width) of the first pulse signal.

The delay compensation circuit 12 performs pre-compensation processing on the first pulse signal based on the rising edge delay value for the photocoupler 3a, and outputs a second pulse signal obtained by the compensation processing to the photocoupler 3a via the node N2, the terminal PAD1, and the node N3.

The photocoupler 3a receives the second pulse signal obtained by the pre-compensation processing. The photocoupler 3a delays the rising edge of the second pulse signal by the rising edge delay time tr. Specifically, a third pulse signal outputted from the photocoupler 3a maintains the same pulse period Tpulse1 as the pulse signal (first pulse signal). The rising edge of the second pulse signal is delayed by the rising edge delay time tr, causing the high-level period (pulse width) to be TH0 and the low-level period to be TL0.

The third pulse signal, which has the same pulse width and duty ratio as the first pulse signal, is transmitted to the receiver circuit 2 via the node N4. As a result, normal data receiving processing is performed by the signal processing circuit 21 of the receiver circuit 2 based on the third pulse signal.

As described above, the asynchronous communication device 101 of the second embodiment is provided with the transmitter circuit 1, the receiver circuit 2, the photocoupler 3a, the wiring LINE1, and the wiring LINE2. The transmitter circuit 1 includes the signal generation circuit 11, the delay compensation circuit 12, and the terminal PAD1. The delay compensation circuit 12 performs delay compensation processing on a first pulse signal using the rising edge delay value 15 corresponding to a rising edge delay value for the photocoupler 3a stored in the settings register 13, and transmits a second pulse signal obtained by the delay pre-compensation processing to the photocoupler 3a. The photocoupler 3a delays the rising edge of the second pulse signal by a rising edge delay time tr, and transmits a third pulse signal with the delayed rising edge to the receiver circuit 2.

Thus, even if a signal transmitted from the transmitter circuit 1 to the receiver circuit 2 suffers a delay, normal data transmission and reception can be achieved.

Figure 9:
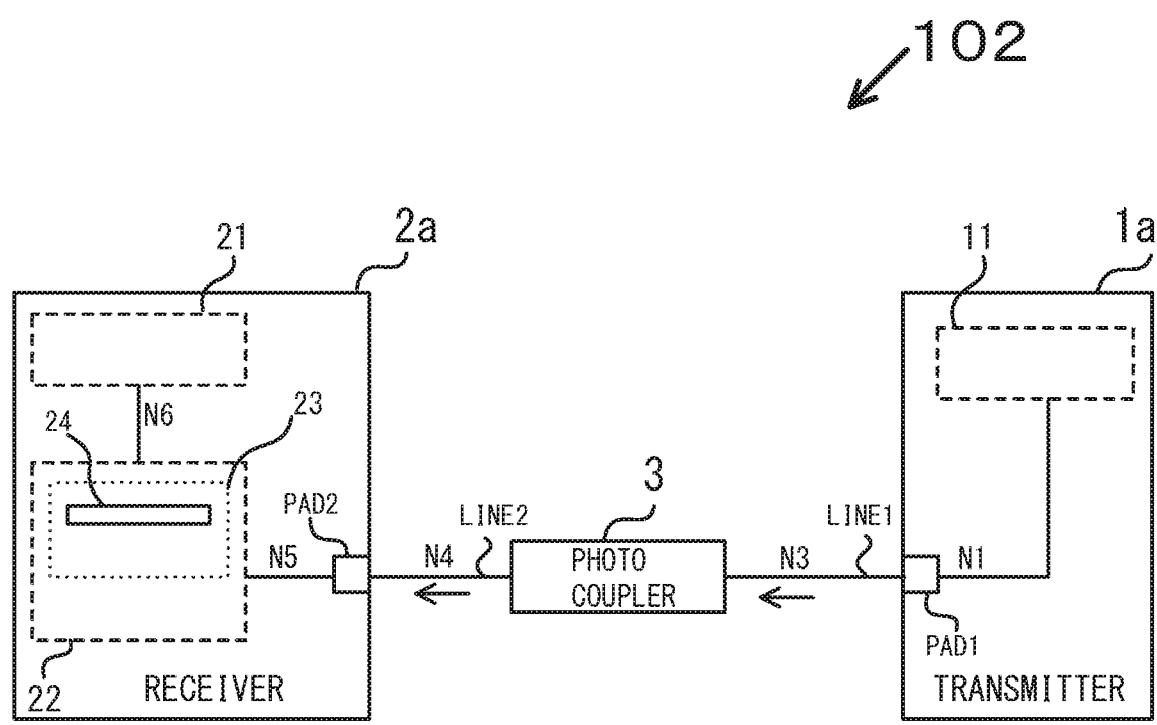
FIG. 9 is a diagram illustrating an asynchronous communication apparatus according to a third embodiment.

Next, an asynchronous communication device according to a third embodiment is described with reference to some of the drawings. FIG. 9 is a diagram illustrating the asynchronous communication device.

In the third embodiment, an acquisition adjustment circuit is provided in a receiver circuit. The acquisition adjustment circuit receives a pulse signal the falling edge of which has been delayed by a photocoupler, and at timing to acquire the delayed pulse signal, performs compensation processing on the delayed pulse signal based on the falling edge delay value for the photocoupler.

The same portions as those in the first embodiment are denoted by the same reference signs and are not described below. Only differences will be described.

As illustrated in FIG. 9, an asynchronous communication device 102 includes a transmitter circuit 1a, a receiver circuit 2a, the photocoupler 3, the wiring LINE1, and the wiring LINE2.

The transmitter circuit 1a includes the signal generation circuit 11 and the terminal PAD1. The signal generation circuit 11 generates a first pulse signal and transmits the first pulse signal to the photocoupler 3 via the node N1, the terminal PAD1, and the node N3.

The photocoupler 3 receives the first pulse signal, delays the falling edge of the first pulse signal by a falling edge delay time tf, and transmits a second pulse signal, which is a signal with the delayed falling edge, to the receiver circuit 2a via the node N4.

The receiver circuit 2a includes the signal processing circuit 21, an acquisition adjustment circuit 22, and the terminal PAD2. The acquisition adjustment circuit 22 includes a settings register 23 having delay values 24. The delay values 24 include a falling edge delay value and a rising edge delay value corresponding to the photocoupler 3.

The acquisition adjustment circuit 22 receives a pulse signal the falling edge of which has been delayed by the photocoupler 3, and at timing to acquire the delayed pulse signal, performs compensation processing on the delayed pulse signal based on the falling delay value for the photocoupler. The compensation processing performed by the acquisition adjustment circuit 22 will be detailed later.

In the asynchronous communication device 102 of the third embodiment, a falling edge delay caused by the photocoupler 3 accounts for most of the signal delay in a signal transmitted from the transmitter circuit 1a to the receiver circuit 2a. For example, the photocoupler 3 uses a photocoupler illustrated in FIG. 2, with a large load resistance (R2) and a high current transfer ratio (CTR).

Figure 10:
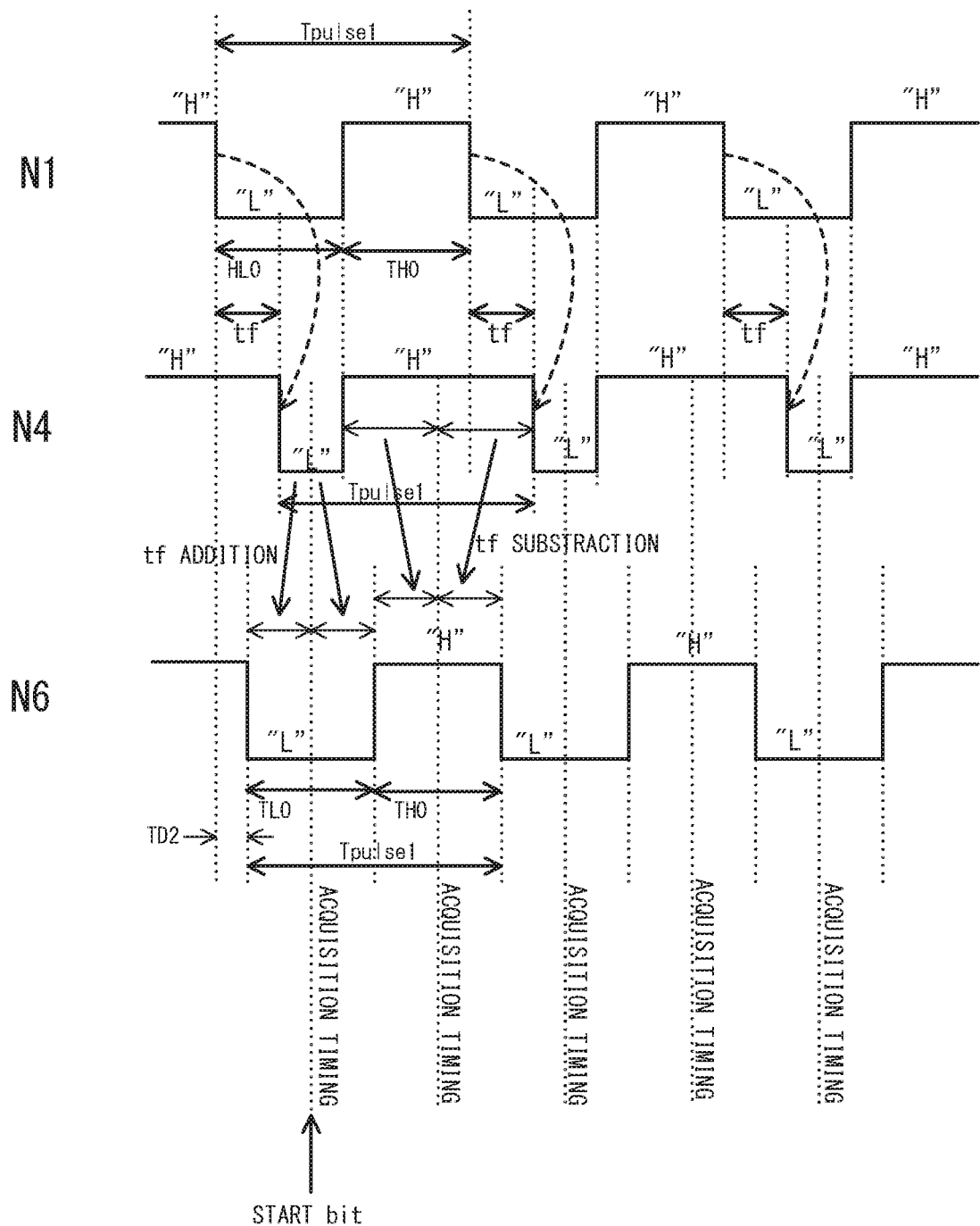
FIG. 10 is a timing chart illustrating operation of the asynchronous communication device according to the third embodiment.

Next, operation of the asynchronous communication device 102 of the third embodiment is described with reference to FIG. 10. FIG. 10 is a timing chart illustrating the operation of the asynchronous communication device.

As illustrated in FIG. 10, once the asynchronous communication device 102 starts operation, a first pulse signal outputted from the signal generation circuit 11 is inputted to the photocoupler 3 via the node N1, the terminal PAD1, and the node N3.

The photocoupler 3 receives the first pulse signal. The photocoupler 3 delays the falling edge of the first pulse signal by a falling edge delay time tf. The waveform of the signal (the waveform of the signal at the node N4 in FIG. 10) is the same as the one illustrated in FIG. 4. A second pulse signal, which is a signal with the delayed falling edge, is inputted to the receiver circuit 2a via the node N4.

The acquisition adjustment circuit 22 receives the second pulse signal with the delayed falling edge. At timing to acquire the second pulse signal, the acquisition adjustment circuit 22 performs compensation processing on the second pulse signal based on a falling edge delay value corresponding to the falling edge delay caused in the pulse signal by the photocoupler 3.

Specifically, a third pulse signal, which is a signal obtained by the compensation processing by the acquisition adjustment circuit 22, maintains the same pulse period Tpulse1 as the second pulse signal outputted from the photocoupler 3. A falling edge delay time tf is added to the low-level period of the second pulse signal with the delayed falling edge, and the falling edge delay time tf is subtracted from the high-level period (pulse width) of the second pulse signal with the delayed falling edge. As a result, the high-level period (pulse width) becomes TH0, and the low-level period becomes TL0. The third pulse signal obtained by the compensation processing has signal delay (TD2) relative to the first pulse signal.

The third pulse obtained by the compensation processing, which is asynchronous with the first pulse signal but has the same pulse width and duty ratio as the first pulse signal, is transmitted to the receiver circuit 2a via a node N6. As a result, normal data receiving processing is performed by the signal processing circuit 21 of the receiver circuit 2a based on the third pulse signal.

As described above, the asynchronous communication device 102 of the third embodiment is provided with the transmitter circuit 1a, the receiver circuit 2a, the photocoupler 3, the wiring LINE1, and the wiring LINE2. The transmitter circuit 1a includes the signal generation circuit 11 and the terminal PAD1. The signal generation circuit 11 generates a first pulse signal and transmits the first pulse signal to the photocoupler 3. The photocoupler 3 receives the first pulse signal, delays the falling edge of the first pulse signal by a falling edge delay time tf, and transmits a second pulse signal, which is a pulse signal with the delayed falling edge, to the receiver circuit 2a. The receiver circuit 2a includes the signal processing circuit 21, the acquisition adjustment circuit 22, and the terminal PAD2. The acquisition adjustment circuit 22 receives the second pulse signal, the falling edge of which has been delayed by the photocoupler 3, and at timing to acquire the delayed pulse signal, performs compensation processing on the delayed pulse signal based on the falling edge delay value for the photocoupler 3. The acquisition adjustment circuit 22 transmits a third pulse signal obtained by the compensation processing, to the signal processing circuit 21.

Thus, even if a signal transmitted from the transmitter circuit 1a to the receiver circuit 2a suffers a delay, normal data transmission and reception can be achieved.

Figure 11:
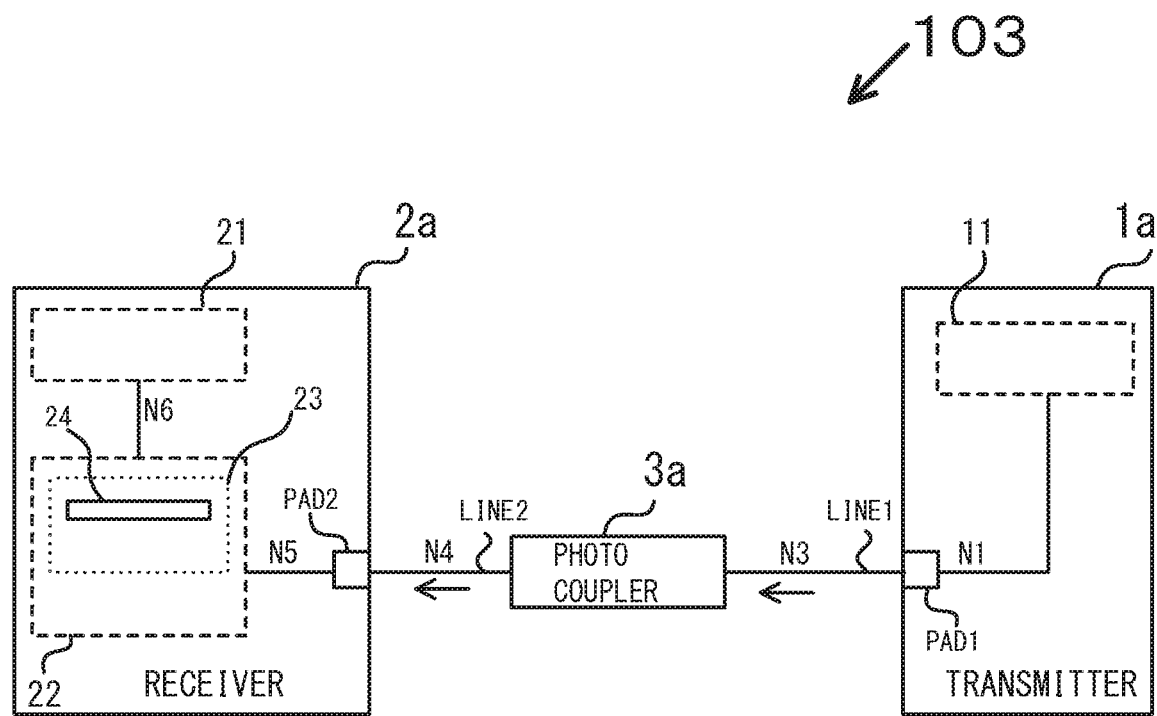
FIG. 11 is a diagram illustrating an asynchronous communication apparatus according to a fourth embodiment.

An asynchronous communication device according to a fourth embodiment is described with reference to some of the drawings. FIG. 11 is a diagram illustrating the asynchronous communication device.

In the fourth embodiment, an acquisition adjustment circuit is provided in a receiver circuit. The acquisition adjustment circuit receives a pulse signal, the rising edge of which has been delayed by a photocoupler, and at timing to acquire the delayed pulse signal, performs compensation processing on the delayed pulse signal based on the rising edge delay value for the photocoupler.

The same portions as those in the third embodiment are denoted by the same reference signs and are not described below. Only differences will be described.

As illustrated in FIG. 11, an asynchronous communication device 103 includes the transmitter circuit 1a, the receiver circuit 2a, the photocoupler 3a, the wiring LINE1, and the wiring LINE2.

The signal generation circuit 11 generates a first pulse signal and transmits the first pulse signal to the photocoupler 3a via the node N1, the terminal PAD1, and the node N3.

The photocoupler 3a receives the first pulse signal, delays the rising edge of the first pulse signal by a rising edge delay time tr, and transmits a second pulse signal, which is the pulse signal with the delayed rising edge, to the receiver circuit 2a via the node N4.

In the asynchronous communication device 103 of the fourth embodiment, a rising edge delay caused by the photocoupler 3a accounts for most of the signal delay in a signal transmitted from the transmitter circuit 1a to the receiver circuit 2a. For example, the photocoupler 3a uses a photocoupler illustrated in FIG. 2, with a small load resistance (R2) and a low current transfer ratio (CTR).

Figure 12:
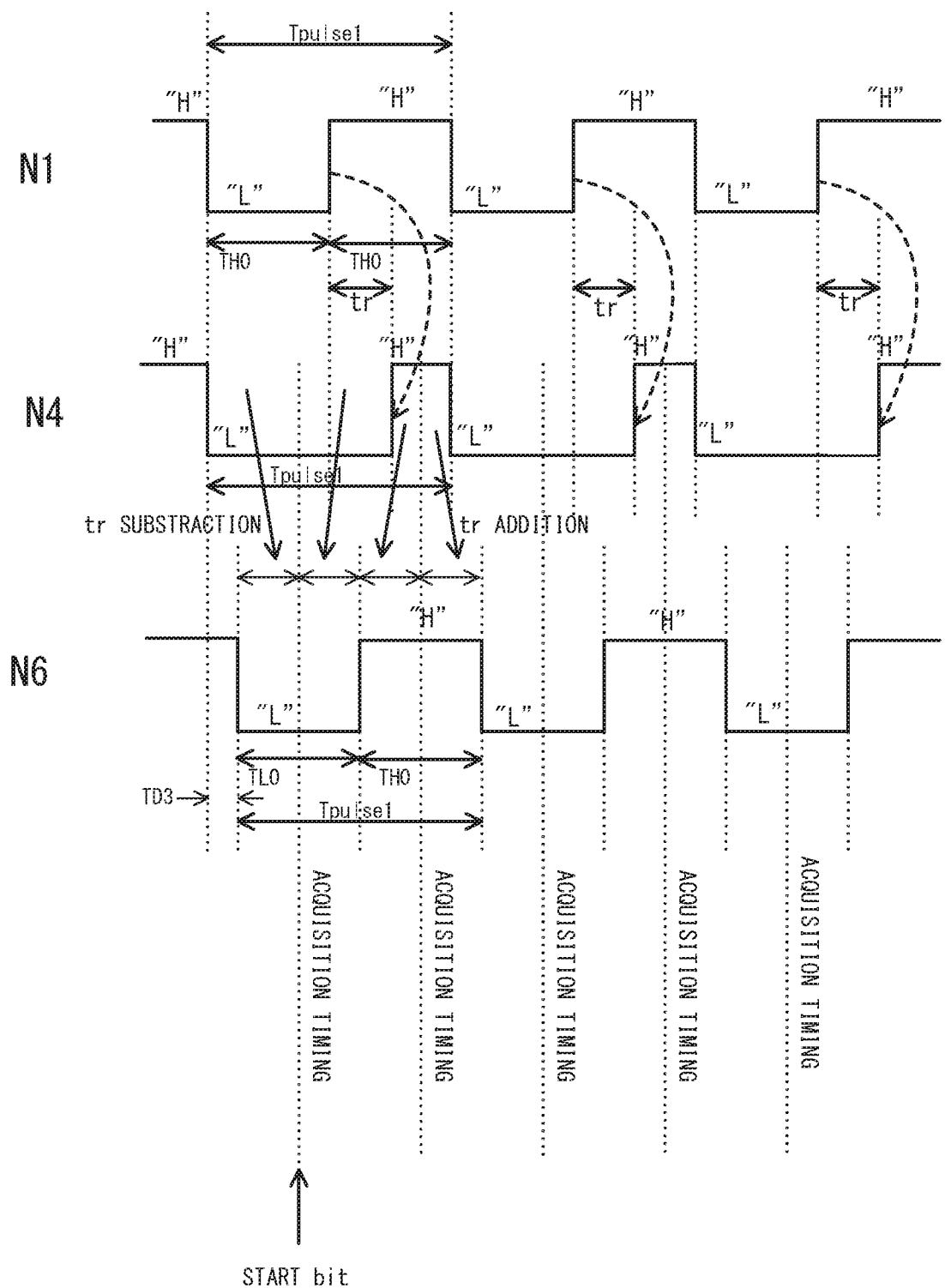
FIG. 12 is a timing chart illustrating operation of the asynchronous communication device according to the fourth embodiment.

Next, operation of the asynchronous communication device 103 of the fourth embodiment is described with reference to FIG. 12. FIG. 12 is a timing chart illustrating the operation of the asynchronous communication device.

As illustrated in FIG. 12, once the asynchronous communication device 103 starts operation, a first pulse signal outputted from the signal generation circuit 11 is inputted to the photocoupler 3a via the node N1, the terminal PAD1, and the node N3.

The photocoupler 3a receives the first pulse signal. The photocoupler 3a delays the rising edge of the first pulse signal by a rising edge delay time tr. The waveform of the signal (the waveform of the signal at the node N4 in FIG. 12) is the same as the one illustrated in FIG. 7. A second pulse signal, which is the pulse signal with the delayed rising edge, is inputted to the receiver circuit 2a via the node N4.

The acquisition adjustment circuit 22 receives the second pulse signal with the delayed rising edge. At timing to acquire the second pulse signal, the acquisition adjustment circuit 22 performs compensation processing on the second pulse signal based on a rising edge delay value corresponding to the delay caused in the pulse signal by the photocoupler 3a.

Specifically, a third pulse signal obtained by the compensation processing by the acquisition adjustment circuit 22 maintains the same pulse period Tpulse1 as the second pulse signal outputted from the photocoupler 3a. A rising edge delay time tr is subtracted from the low-level period of the second pulse signal with the delayed rising edge, and the rising edge delay time tr is added to the high-level period (pulse width) of the second pulse signal with the delayed rising edge. As a result, the high-level period (pulse width) becomes TH0, and the low-level period becomes TL0. The third pulse signal obtained by the compensation processing has signal delay (TD3) relative to the pulse signal (first pulse signal).

The third pulse obtained by the compensation processing, which is asynchronous with the first pulse signal but has the same pulse width and duty ratio as the first pulse signal, is transmitted to the receiver circuit 2a via the node N6. As a result, normal data receiving processing is performed by the signal processing circuit 21 of the receiver circuit 2a based on the third pulse signal.

As described above, the asynchronous communication device 103 of the fourth embodiment is provided with the transmitter circuit 1a, the receiver circuit 2a, the photocoupler 3a, the wiring LINE1, and the wiring LINE2. The transmitter circuit 1a includes the signal generation circuit 11 and the terminal PAD1. The signal generation circuit 11 generates a first pulse signal and transmits the first pulse signal to the photocoupler 3a. The photocoupler 3a receives the first pulse signal, delays the rising edge of the first pulse signal by a rising edge delay time tr, and transmits a second pulse signal, which is the pulse signal with the delayed rising edge, to the receiver circuit 2a. The receiver circuit 2a includes the signal processing circuit 21, the acquisition adjustment circuit 22, and the terminal PAD2. The acquisition adjustment circuit 22 receives the second pulse signal, the rising edge of which has been delayed by the photocoupler 3a, and at timing to acquire the delayed pulse signal, performs compensation processing on the delayed pulse signal based on a rising edge delay value for the photocoupler 3a. The acquisition adjustment circuit 22 transmits a third pulse signal obtained by the compensation processing to the signal processing circuit 21.

Thus, even if a signal transmitted from the transmitter circuit 1a to the receiver circuit 2a suffers a delay, normal data transmission and reception can be achieved.

Figure 13:
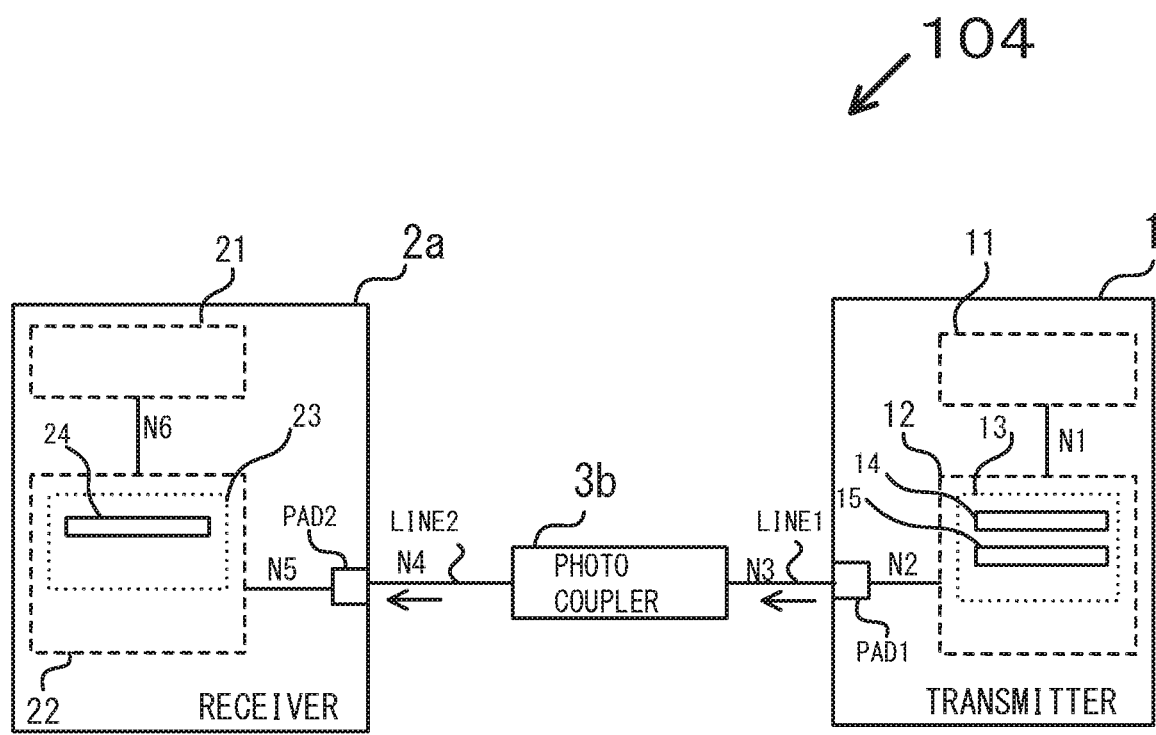
FIG. 13 is a diagram illustrating an asynchronous communication apparatus according to a fifth embodiment.

An asynchronous communication device according to a fifth embodiment is described with reference to some of the drawings. FIG. 13 is a diagram illustrating the asynchronous communication device.

In the asynchronous communication device of the fifth embodiment, a delay compensation circuit is provided in a transmitter circuit, and an acquisition adjustment circuit is provided in a receiver circuit. The delay compensation circuit or the acquisition adjustment circuit is used to perform compensation processing to compensate for a falling or rising edge delay caused in a pulse signal by a photocoupler.

The same portions as those in the first to fourth embodiments are denoted by the same reference signs and are not described below. Only differences will be described.

As illustrated in FIG. 13, an asynchronous communication device 104 includes the transmitter circuit 1, the receiver circuit 2a, a photocoupler 3b, the wiring LINE1, and the wiring LINE2.

The transmitter circuit 1 includes the signal generation circuit 11, the delay compensation circuit 12, and the terminal PAD1. The delay compensation circuit 12 includes the settings register 13 having the falling edge delay value 14 and the rising edge delay value 15.

The receiver circuit 2a includes the signal processing circuit 21, the acquisition adjustment circuit 22, and the terminal PAD2. The acquisition adjustment circuit 22 includes the settings register 23 having the delay values 24. The delay values 24 include a falling edge delay value and a rising edge delay value corresponding to the photocoupler 3b.

The photocoupler 3b is provided between the transmitter circuit 1 and the receiver circuit 2a and performs switching operation on a pulse signal outputted from the transmitter circuit 1. The photocoupler 3b delays the falling or rising edge of a pulse signal depending on factors such as the operation conditions and the surrounding environment of the asynchronous communication device 104.

Thus, the asynchronous communication device 104 selectively uses the delay compensation circuit 12 or the acquisition adjustment circuit 22 to compensate for the rising or falling edge delay caused in a pulse signal by the photocoupler 3b.

Since the compensation processing by the delay compensation circuit 12 and the compensation processing by the acquisition adjustment circuit 22 have already been described in the first and second embodiments and in the third and fourth embodiments, respectively the details are omitted here.

As described above, the asynchronous communication device 104 of the fifth embodiment is provided with the transmitter circuit 1, the receiver circuit 2a, the photocoupler 3b, the wiring LINE1, and the wiring LINE2. The asynchronous communication device 104 selectively uses pulse signal compensation processing by the delay compensation circuit 12 and pulse signal compensation processing by the acquisition adjustment circuit 22.

Thus, even if a signal transmitted from the transmitter circuit 1 to the receiver circuit 2a suffers a delay, normal data transmission and reception can be achieved.

Figure 14:
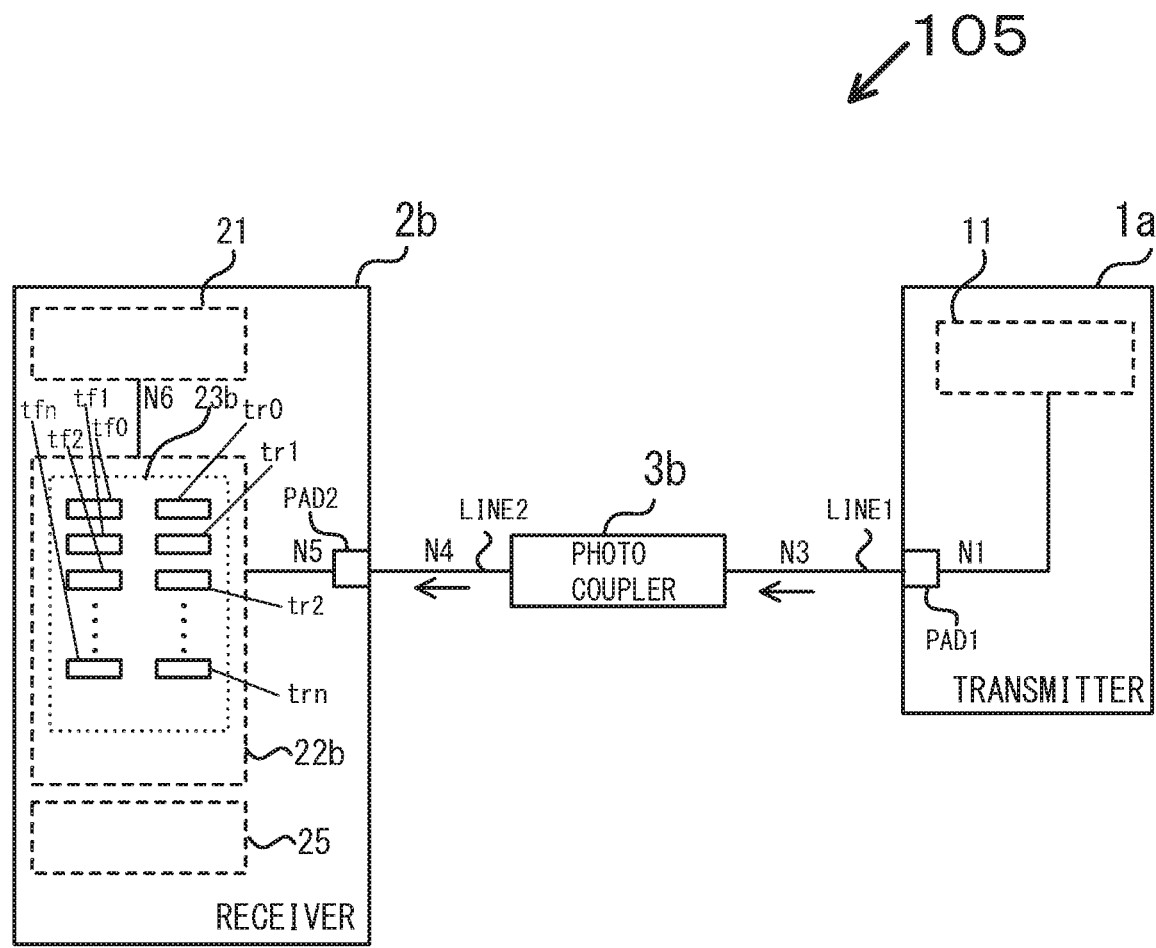
FIG. 14 is a diagram illustrating an asynchronous communication apparatus according to a sixth embodiment.

An asynchronous communication device according to a sixth embodiment is described with reference to some of the drawings. FIG. 14 is a diagram illustrating the asynchronous communication device.

In the sixth embodiment, a temperature sensor and an acquisition adjustment circuit are provided in a receiver circuit. The temperature sensor monitors ambient temperature, and the acquisition adjustment circuit uses a falling edge delay value or a rising edge delay value corresponding to the ambient temperature to perform compensation processing to compensate for the falling or rising edge delay caused in a pulse signal by a photocoupler.

The same portions as those in the fifth embodiment are denoted by the same reference signs and are not described below. Only differences will be described.

As illustrated in FIG. 14, an asynchronous communication device 105 includes the transmitter circuit 1a, a receiver circuit 2b, the photocoupler 3b, the wiring LINE1, and the wiring LINE2.

The transmitter circuit 1a includes the signal generation circuit 11 and the terminal PAD1. The receiver circuit 2b includes the signal processing circuit 21, an acquisition adjustment circuit 22b, a temperature sensor 25, and the terminal PAD2.

The acquisition adjustment circuit 22b includes a settings register 23b. The settings register 23b includes falling edge delay values tf0 to tfn and rising edge delay values tr0 to trn.

The falling edge delay values tf0 to tfn and the rising edge delay values tr0 to trn are values corresponding to the photocoupler 3b.

As illustrated in FIG. 15, the photocoupler has temperature characteristics such that the falling edge delay value and the rising edge delay value are respectively tf0 and tr0 at an ambient temperature T0 which is relatively low, tf1 and tr1 at an ambient temperature T1 higher than the ambient temperature T0, tf2 and tr2 at an ambient temperature T2 higher than the ambient temperature T1, and tfn and trn at an ambient temperature Tn which is higher than the ambient temperature T2 and relatively high.

The falling edge delay values are such that tf0<ft1<tf2 . . . <tfn. For instance, the falling edge delay value at an ambient temperature of 125° C. is approximately three times as high as that at an ambient temperature of −25° C. By contrast, the rising edge delay value does not change much according to the ambient temperature, and tr0, tr1, tr2, . . . , and trn are substantially the same value.

When the ambient temperature of the asynchronous communication device 105 is relatively low, a pulse signal from the photocoupler 3b suffers mostly a rising edge delay. By contrast, when the ambient temperature of the asynchronous communication device 105 is relatively high, a pulse signal from the photocoupler 3b suffers mostly a falling edge delay.

When the ambient temperature of the asynchronous communication device 105 monitored by the temperature sensor 25 is relatively high, the acquisition adjustment circuit 22b performs compensation processing to compensate for a falling edge delay caused by the photocoupler 3b based on a falling edge delay value corresponding to the ambient temperature.

When the ambient temperature of the asynchronous communication device 105 monitored by the temperature sensor 25 is relatively low, the acquisition adjustment circuit 22b performs compensation processing to compensate for a rising edge delay caused by the photocoupler 3b based on a rising edge delay value corresponding to the ambient temperature.

As described above, the asynchronous communication device 105 of the sixth embodiment is provided with the transmitter circuit 1a, the receiver circuit 2b, the photocoupler 3b, the wiring LINE1, and the wiring LINE2. The transmitter circuit 1a includes the signal generation circuit 11 and the terminal PAD1. The receiver circuit 2b includes the signal processing circuit 21, the acquisition adjustment circuit 22b, the temperature sensor 25, and the terminal PAD2. The temperature sensor 25 monitors ambient temperature, and based on a falling edge delay value or a rising edge delay value corresponding to the ambient temperature, the acquisition adjustment circuit 22b performs compensation processing to compensate for a falling or rising edge delay caused in a pulse signal by the photocoupler 3b.

Thus, even if a signal transmitted from the transmitter circuit 1a to the receiver circuit 2b suffers a delay, normal data transmission and reception can be achieved.

In the sixth embodiment, compensation processing is performed in the receiver circuit to compensate for a falling or rising edge delay caused in a pulse signal by the photocoupler 3b. Alternatively, with a settings register having the falling edge delay values tf0 to tfn and the rising edge delay values tr0 to trn being provided in the transmitter circuit, compensation processing may be performed by the delay compensation circuit in the transmitter circuit to pre-compensate for a falling or rising edge delay caused in a pulse signal by the photocoupler 3b, and a pulse signal obtained by the pre-compensation processing may be transmitted to the photocoupler 3b.

Further, the delay values may be calculated in advance based on monitored results of the transmitter circuit and the receiver circuit and registered in the settings register. The delay values may be changed to appropriate setting values if necessary.

While certain embodiments have been described, these embodiments have been presented by way of example only, and are not intend to limit the scope of the inventions. Indeed, the novel embodiments described herein may be embodied in a variety of the other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An asynchronous communication device comprising:
   a transmitter circuit including
      a signal generation circuit configured to output a first pulse signal, and
      a delay compensation circuit configured to receive the first pulse signal, perform delay compensation processing on a pulse width of the first pulse signal, and output a second pulse signal obtained by the delay compensation processing;
   delay circuitry configured to receive the second pulse signal, cause delay in a falling edge or a rising edge of the second pulse signal, and output a third pulse signal in which the delay is caused; and
   a receiver circuit configured to receive the third pulse signal and perform signal processing based on the third pulse signal, wherein
   the delay compensation circuit performs pre-compensation processing on the first pulse signal based on a delay value of the delay to be caused by the delay circuitry, while maintaining a pulse period of the first pulse signal.

2. The asynchronous communication device according to claim 1, wherein
   the delay compensation circuit includes a settings register storing delay value information on a falling edge delay value or a rising edge delay value of the delay to be caused by the delay circuitry.

3. The asynchronous communication device according to claim 1, wherein
   when the delay circuitry causes delay in the falling edge of the second pulse signal by a first delay value, the delay compensation circuit adds the first delay value to a low-level period of the second pulse signal and subtracts the first delay value from a high-level period of the second pulse signal.

4. The asynchronous communication device according to claim 1, wherein
   when the delay circuitry causes delay in the rising edge of the second pulse signal by a second delay value, the delay compensation circuit subtracts the second delay value from a low-level period of the second pulse signal and adds the second delay value to a high-level period of the second pulse signal.

5. The asynchronous communication device according to claim 1, wherein
   the delay circuitry is a photocoupler or an isolator.

6. The asynchronous communication device according to claim 5, wherein the photocoupler includes a photodiode, a light-receiving transistor, and a load resistance.

7. The asynchronous communication device according to claim 6, wherein
   when the load resistance has a large value, the delay compensation circuit performs compensation processing according to a falling edge delay to be caused by the delay circuitry.

8. The asynchronous communication device according to claim 6, wherein
   when the load resistance is small, the delay compensation circuit performs compensation processing to compensate for a rising edge delay to be caused by the delay circuitry.

9. The asynchronous communication device according to claim 1, wherein the asynchronous communication device is incorporated in a microcontroller.

10. An asynchronous communication device comprising:
    a transmitter circuit including a signal generation circuit to output a first pulse signal;
    delay circuitry configured to receive the first pulse signal, cause delay in a falling edge or a rising edge of the first pulse signal, and output a second pulse signal in which the delay is caused; and
    a receiver circuit including
       an acquisition adjustment circuit configured to
          receive the second pulse signal,
          at timing to acquire the second pulse signal, perform compensation processing on the second pulse signal based on a falling edge value or a rising edge value corresponding to the delay caused in the second pulse signal by the delay circuitry, while maintaining a pulse period of the second pulse signal, and
          output a third pulse signal obtained by the compensation processing, the receiver circuit performing signal processing based on the third pulse signal.

11. The asynchronous communication device according to claim 10, wherein
    the acquisition adjustment circuit includes a settings register storing delay value information on a falling edge delay value or a rising edge delay value of the delay to be caused by the delay circuitry.

12. The asynchronous communication device according to claim 11, wherein
    when the delay circuitry causes delay in the falling edge of the first pulse signal by a first delay value,
    the acquisition adjustment circuit adds the first delay value to a low-level period of the second pulse signal and subtracts the first delay value from a high-level period of the second pulse signal.

13. The asynchronous communication device according to claim 11, wherein
    when the delay circuitry causes delay in the rising edge of the first pulse signal by a second delay value,
    the acquisition adjustment circuit subtracts the second delay value from a low-level period of the second pulse signal and adds the second delay value to a high-level period of the second pulse signal.

14. An asynchronous communication device comprising:
    a transmitter circuit including a signal generation circuit to output a first pulse signal;
    delay circuitry configured to receive the first pulse signal, cause delay in a falling edge or a rising edge of the first pulse signal, and output a second pulse signal in which the delay is caused; and a receiver circuit including
a temperature sensor configured to measure ambient temperature, and
an acquisition adjustment circuit having a plurality of falling edge delay values and a plurality of rising edge delay values for the delay circuitry corresponding to different levels of ambient temperature and configured to
receive the second pulse signal,
at timing to acquire the second pulse signal, perform compensation processing on the second pulse signal based on the falling edge delay value or the rising edge delay value corresponding to the delay caused in the second pulse signal by the delay unit and corresponding to the ambient temperature measured by the temperature sensor, while maintaining pulse period of the second pulse, and
output a third pulse signal obtained by the compensation processing, the receiver circuit performing signal processing based on the third pulse signal.

15. The asynchronous communication device according to claim 14, wherein
the acquisition adjustment circuit includes a settings register storing delay value information on a falling edge delay value or a rising edge delay value of the delay caused by the delay circuitry.

16. The asynchronous communication device according to claim 14, wherein
the delay circuitry is a photocoupler or an isolator.

17. The asynchronous communication device according to claim 16,
when the delay circuitry is the photocoupler,
the acquisition adjustment circuit performs the compensation processing using the falling edge delay value stored in a settings register when the ambient temperature of the asynchronous communication device monitored by the temperature sensor is high.

18. The asynchronous communication device according to claim 16,
when the delay circuitry is the photocoupler,
the acquisition adjustment circuit performs the compensation processing using the rising edge delay value stored in a settings register when the ambient temperature of the asynchronous communication device monitored by the temperature sensor is low.

19. The asynchronous communication device according to claim 15, wherein
the settings register stores the falling edge delay value or the rising edge delay value obtained in advance by monitoring of the receiver circuit for delay caused by the delay circuitry.

* * * * *